(12) United States Patent
Fukushima

(10) Patent No.: US 9,627,617 B2
(45) Date of Patent: Apr. 18, 2017

(54) METHOD FOR MANUFACTURING ORGANIC EL PANEL

(71) Applicant: JOLED INC., Tokyo (JP)

(72) Inventor: Miki Fukushima, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/914,103

(22) PCT Filed: Apr. 17, 2015

(86) PCT No.: PCT/JP2015/002128
§ 371 (c)(1),
(2) Date: Feb. 24, 2016

(87) PCT Pub. No.: WO2015/162893
PCT Pub. Date: Oct. 29, 2015

(65) Prior Publication Data
US 2016/0211449 A1    Jul. 21, 2016

(30) Foreign Application Priority Data

Apr. 22, 2014    (JP) .................................. 2014-088470

(51) Int. Cl.
*H01L 51/52*    (2006.01)
*H01L 51/00*    (2006.01)
(Continued)

(52) U.S. Cl.
CPC ........ *H01L 51/0002* (2013.01); *H01L 27/322* (2013.01); *H01L 51/524* (2013.01); *H01L 51/5246* (2013.01); *H01L 51/56* (2013.01)

(58) Field of Classification Search
CPC ......... H01L 51/00; H01L 51/56; H01L 51/52; H01L 27/32
(Continued)

(56) References Cited

U.S. PATENT DOCUMENTS 6,650,393 B1 * 11/2003 Nishiguchi ........... G02F 1/1339
349/156
7,169,636 B2    1/2007 Maruyama et al.
(Continued)

FOREIGN PATENT DOCUMENTS

JP    2004-207234    7/2004
JP    2005-095745    4/2005
(Continued)

OTHER PUBLICATIONS

International Search Report (ISR) from International Searching Authority (Japan Patent Office) in International Pat. Appl. No. PCT/JP2015/002128, dated Jul. 14, 2015.

*Primary Examiner* — Asok K Sarkar
*Assistant Examiner* — Dmitriy Yemel Yanov
(74) *Attorney, Agent, or Firm* — Greenblum & Bernstein, P.L.C.

(57) ABSTRACT

A method for manufacturing an organic EL panel includes: applying sealing resin for forming a sealing resin layer to a plurality of spots on an application target surface of one of an EL substrate and a CF substrate, the application target surface being a surface to which the sealing resin is to be applied, and stacking the EL substrate and the CF substrate one on top of the other after the sealing resin is applied, and when the sealing resin is applied, the amount of the sealing resin applied to a spot near an edge of the application target surface is less than the amount of the sealing resin applied to a spot further inward than the spot near the edge.

9 Claims, 10 Drawing Sheets

(51) Int. Cl.
*H01L 27/32* (2006.01)
*H01L 51/56* (2006.01)

(58) Field of Classification Search
USPC .......................................................... 438/26
See application file for complete search history.

(56) References Cited

U.S. PATENT DOCUMENTS

| | | |
|---|---|---|
| 7,569,859 B2 | 8/2009 | Maruyama et al. |
| 8,044,411 B2 | 10/2011 | Maruyama et al. |
| 8,237,176 B2 | 8/2012 | Maruyama et al. |
| 8,482,011 B2 | 7/2013 | Maruyama et al. |
| 8,629,614 B2 | 1/2014 | Nakamura et al. |
| 8,884,849 B2 | 11/2014 | Masuda |
| 9,155,135 B2 | 10/2015 | Okumura |
| 9,252,390 B2 | 2/2016 | Okumura et al. |
| 2004/0121602 A1* | 6/2004 | Maruyama ............ H01L 51/524 438/689 |
| 2005/0126700 A1* | 6/2005 | Makimoto ............... B32B 37/24 156/285 |
| 2007/0120132 A1 | 5/2007 | Maruyama et al. |
| 2009/0289548 A1 | 11/2009 | Maruyama et al. |
| 2011/0084290 A1 | 4/2011 | Nakamura et al. |
| 2012/0038269 A1 | 2/2012 | Maruyama et al. |
| 2012/0287026 A1 | 11/2012 | Masuda |
| 2012/0299025 A1 | 11/2012 | Maruyama et al. |
| 2015/0050445 A1 | 2/2015 | Osako |
| 2015/0054006 A1 | 2/2015 | Okumura et al. |

FOREIGN PATENT DOCUMENTS

| | | |
|---|---|---|
| JP | 2005-243413 | 9/2005 |
| JP | 2008-235089 | 10/2008 |
| WO | 2010/004865 | 1/2010 |
| WO | 2012/011268 | 1/2012 |

* cited by examiner

METHOD FOR MANUFACTURING ORGANIC EL PANEL

TECHNICAL FIELD

The present disclosure relates to a method for manufacturing an organic electroluminescent (EL) panel which includes an organic EL element.

BACKGROUND ART

An organic EL panel which includes organic EL elements is known as an image display device which includes current-drive light emitting elements. This organic EL panel is a self-emissive display panel having organic EL elements disposed between two glass substrates, and may be used as a light source of a lighting device.

Patent Literature 1 discloses a display panel in which an EL substrate having organic EL elements formed on one side and a color filter (CF) substrate on which a color filter is formed are opposed to one another with a sealing resin layer therebetween, and sealed together at the edge portions by a fritted glass portion and a seal portion.

CITATION LIST

Patent Literature

[PTL 1] International Publication No. WO 2012/011268

SUMMARY OF INVENTION

Technical Problem

The present disclosure provides a method for manufacturing an organic EL panel, according to which a resin layer is highly accurately formed between a second substrate and an EL substrate which includes a first substrate and an organic EL element.

Solution to Problem

A method for manufacturing an organic EL panel according to the present disclosure is a method for manufacturing an organic electroluminescent (EL) panel which includes: an EL substrate that includes a first substrate and an organic EL element stacked on the first substrate; and a second substrate disposed in a position opposed to the first substrate with the organic EL element and a resin layer between the second substrate and the first substrate, the method including: (a) applying resin for forming the resin layer to a plurality of spots on an application target surface of one of the EL substrate and the second substrate, the application target surface being a surface to which the resin is to be applied; and (b) stacking the EL substrate and the second substrate one on top of another after step (a), wherein in step (a), an amount of the resin applied to a spot near an edge of the application target surface is less than an amount of the resin applied to a spot further inward than the spot near the edge.

Advantageous Effects of Invention

A method for manufacturing an organic EL panel according to the present disclosure allows highly accurately forming a resin layer between a second substrate and an EL substrate which includes a first substrate and an organic EL element.

DESCRIPTION OF EMBODIMENTS

Figure 1:
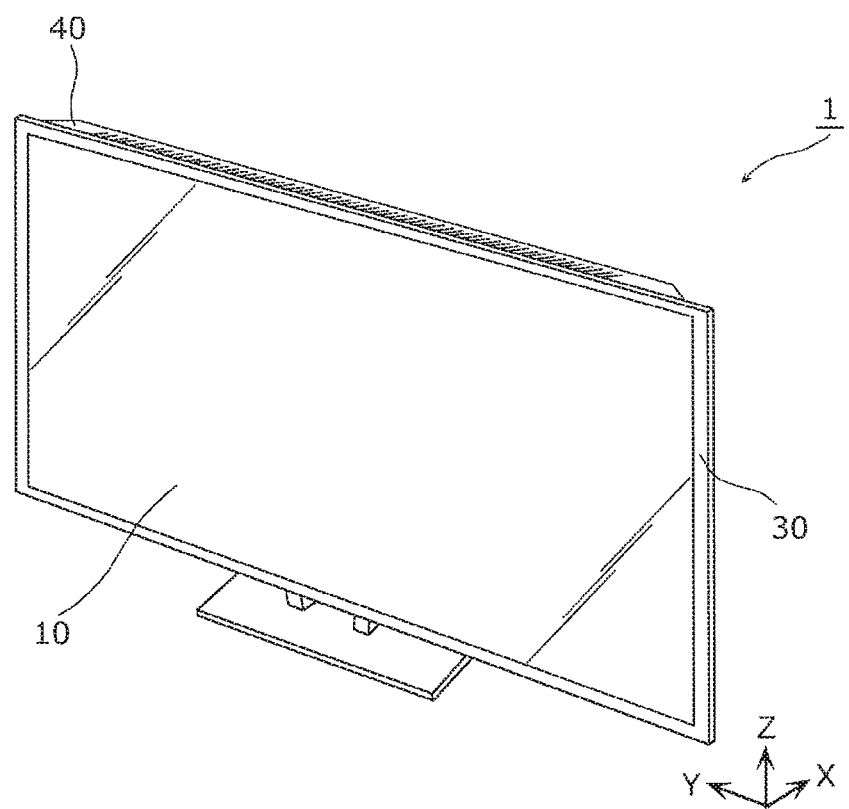
FIG. 1 is an external perspective view of an image display device according to an embodiment.

The inventor of the present application has found that a conventional organic EL panel has the following problems.

In the conventional organic EL panel, an EL substrate and a glass substrate (CF substrate) on which a color filter is formed are bonded via a resin layer, as with a display device disclosed in PTL 1 above, for example.

The above resin layer has a role of sealing organic EL elements. Thus, the resin layer is referred to as a "sealing resin layer", and the resin used as the material of the layer is referred to "sealing resin", for example.

The EL substrate and the CF substrate are bonded following the procedure below, for example. Specifically, a dam is formed by applying resin along edges of the CF substrate on the color filter side (inner surface) and sealing resin is applied inside the dam. After that, the EL substrate is stacked on the side of the CF substrate to which sealing resin is applied. The stacked substrates are subjected to, for instance, a pressure application process and a curing process, thus completing the organic EL panel.

Here, for example, a fixed amount of sealing resin is applied to an inner surface of a CF substrate at regular intervals when sealing resin is applied to the CF substrate, as disclosed in PTL 1 mentioned above. For example, drops of a fixed amount of sealing resin are discharged (dripped) by piezo drive onto the inner surface of the CF substrate, at regular intervals and in matrix form.

Specifically, sealing resin is applied in dot form to a plurality of spots on the inner surface of the CF substrate, and an EL substrate is stacked thereon and pressed. In this manner, sealing resin dots expand on the inner surface of the CF substrate. After that, the stacked substrates are subjected to, for instance, a pressure application process so that a sealing resin layer is formed between the CF substrate and the EL substrate, in a spatial region inside the dam on the CF substrate.

Here, when the sealing resin layer is formed in this manner, a plurality of sealing resin dots each expand radially (substantially concentrically) from the application spot where the dot resin is applied. In contrast, a dam which defines a planar region where sealing resin is applied has a rectangular shape. Specifically, the dam is formed along the edges of the inner surface of the CF substrate such that four linear walls define a region where sealing resin is to be present.

Thus, a spot to which resin is applied may be set away from the dam to prevent protrusion of the sealing resin layer that is expanding radially (substantially concentrically) beyond the linear dam. Yet, this causes a problem that the sealing resin layer is insufficiently formed at and near the dam.

In this manner, if a fixed amount of sealing resin is applied to a plurality of spots at regular intervals in a region of the CF substrate surrounded by the dam, problems may arise at and near the dam that the sealing resin protrudes beyond the dam and a gap in the sealing resin layer is generated due to excessive and insufficient amounts of the applied sealing resin.

Note that the gap in the sealing resin layer may contain air including moisture, and consequently organic EL elements, for instance, may be damaged by the moisture. Accordingly, when manufacturing an organic EL panel, it is important to prevent a gap, independently of whether the location of a gap is within an area for displaying an image.

Conventionally, when sealing resin for filling a space between two types of substrates (two substrates) is applied to the inner surface of one of the substrates in the manufacture of an organic EL panel, a fixed amount of sealing resin is applied to a plurality of spots at equal intervals, as described above. In this manner, sealing resin in an amount necessary for forming a sealing resin layer can be evenly distributed over a surface to which sealing resin is to be applied.

However, the eventual shape (presence area) of the sealing resin layer formed between the two substrates depends on expansion of sealing resin dots, and thus problems as described above easily arise such as protrusion of the sealing resin beyond the dam or generation of a gap at and near the dam.

The present disclosure has been conceived based on such experiences, and the inventor of the present application has obtained, as a result of diligent examination, an idea for a method for manufacturing an organic EL panel, according to which a resin layer is highly accurately formed between two types of substrates included in the organic EL panel.

The following describes an embodiment with reference to the drawings as appropriate. An excessively detailed description may be omitted, however. For example, a detailed description of a matter already known well and a redundant description of substantially the same configuration may be omitted. This aims to prevent the following description from being unnecessarily redundant, and to facilitate the understanding of persons skilled in the art.

Note that the inventor of the present application provides the accompanying drawings and the following description in order that persons skilled in the art sufficiently understand the present disclosure, and does not intend to limit the disclosed subject matter of the claims by these.

The following describes an embodiment and a variation thereof, with reference to FIGS. 1 to 14. The first describes a schematic configuration of an image display device according to the embodiment, with reference to FIGS. 1 and 2.

1-1. Schematic Configuration of Mage Display Device

FIG. 1 is an external perspective view of an image display device 1 according to an embodiment.

Figure 2:
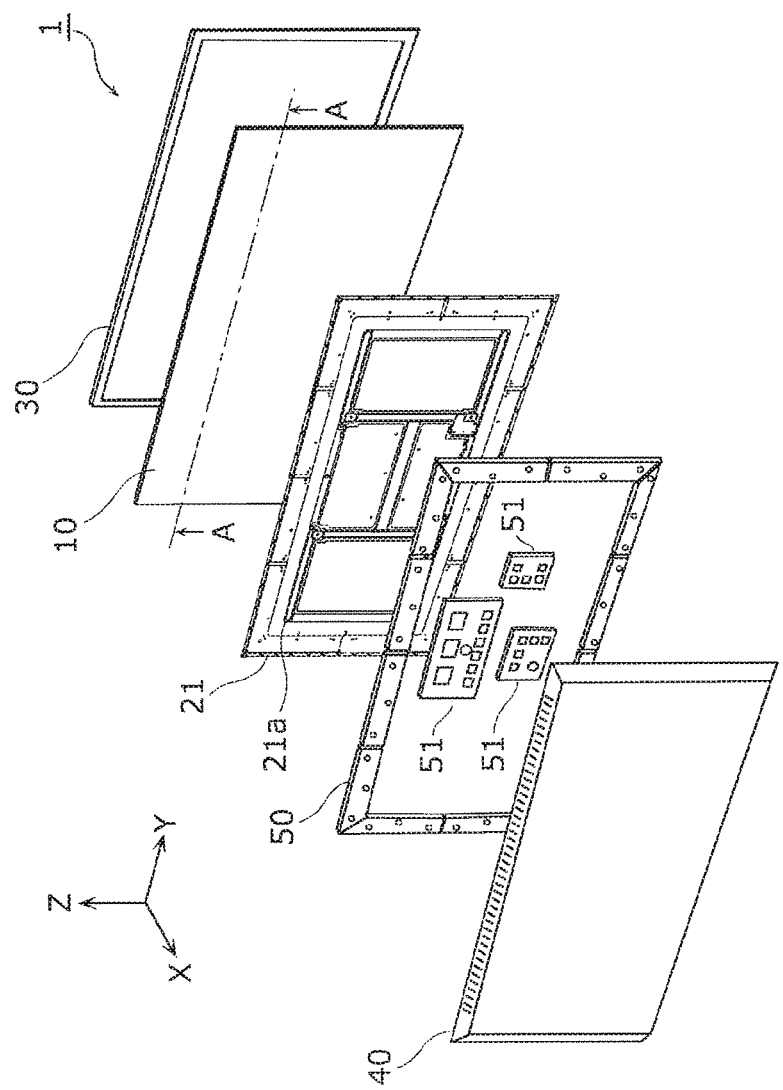
FIG. 2 is an exploded perspective view of the image display device according to the embodiment.

FIG. 2 is an exploded perspective view of the image display device 1 according to the embodiment.

As illustrated in FIGS. 1 and 2, the image display device 1 according to the present embodiment includes an organic EL panel 10 which displays an image on the front, circuit boards 50 and 51 disposed on the back side of the organic EL panel 10, and a back cover 40. The back cover 40 is disposed on the side where the circuit boards 50 and 51 are disposed, which is the side opposite the organic EL panel 10.

In the present embodiment, the image display device 1 further includes a chassis 21 which is disposed between the organic EL panel 10 and the circuit boards 50, and holds the organic EL panel 10. The circuit boards 50 and 51 are disposed on the side (back side) of the chassis 21 opposite the organic EL panel 10.

In addition, the image display device 1 further includes a rectangular rim-shaped frame (frame) 30 which covers the edges of the organic EL panel 10 on the front side. The frame 30 and the back cover 40 are formed using resin material, for example.

In this manner, the image display device 1 has a structure in which the organic EL panel 10 and the chassis 21 to which the circuit boards 50 and 51 are attached are disposed between the frame 30 and the back cover 40.

The image display device 1 as described above is achieved as, for example, a television receiver (television) which outputs video signals and audio signals that are obtained from, for instance, received broadcast waves.

Specifically, the organic EL panel 10 according to the present embodiment is included, as a module which displays an image, in the image display device 1 which is a TV.

Each of the circuit boards 50 disposed on the back side of the chassis 21 is a drive circuit board on which a drive circuit (driver) which applies a signal voltage to the organic EL panel 10. The circuit boards 50 are disposed along the edges of the chassis 21 on the back side, and at the same time, connected to the organic EL panel 10 via flexible cables.

The circuit boards 51 are attached in a predetermined region which includes a center portion of the chassis 21 on the back side. Electronic circuits included in the circuit boards 51 include a signal processing circuit which processes a received video signal, a control circuit which controls operation of a scan drive circuit and a signal line drive circuit, and a power supply circuit which receives power from the outside and supplies the power to the circuits.

Note that although the image display device 1 includes other elements which are not illustrated in FIG. 2, such as the flexible cables which connect the organic EL panel 10 and the circuit boards 50, the illustration and description of such other elements are omitted in order to clearly show features of the organic EL panel 10 according to the present disclosure.

The chassis 21 is a metal member, for example, and has a protrusion 21a projecting from the side opposite the organic EL panel 10.

The chassis 21 according to the present embodiment is a member formed by performing a press process, such as a drawing process, on a rectangular metal sheet member (metal plate) made of aluminum or iron, to form the protrusion 21a.

For example, the protrusion 21a can be formed by drawing an aluminum plate having a thickness of 0.6 mm. Forming the protrusion 21a (drawn portion) as described above increases the rigidity of the chassis 21.

At least the center and edge portions of the chassis 21 are regions in which the protrusion 21a is not formed, and since the circuit boards 50 and 51 are disposed in such regions, the thicknesses of the circuit boards 50 and 51 have no or little influence on the thickness of the image display device 1.

The following describes a basic configuration of the organic EL panel 10 included in the image display device 1 having the above configuration, with reference to FIGS. 3 to 6.

1-2. Organic EL Panel

Figure 3:
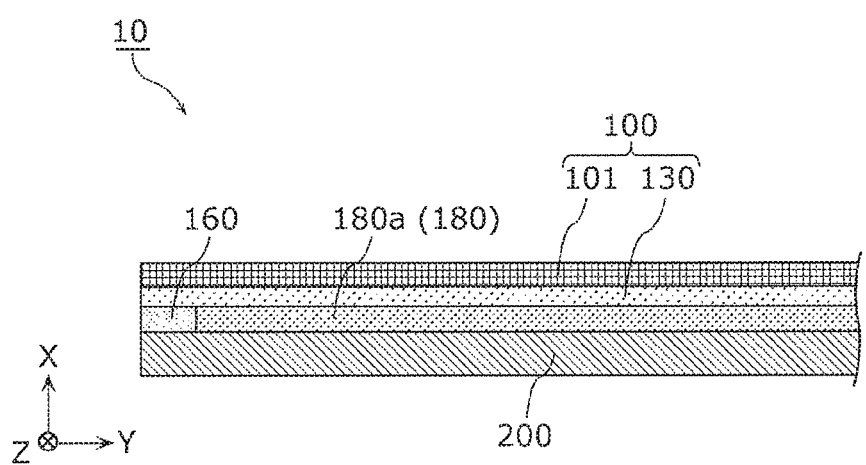
FIG. 3 is a cross-sectional schematic diagram of an organic EL panel according to the embodiment.

FIG. 3 is a cross-sectional schematic diagram of the organic EL panel 10 according to the embodiment. Note that FIG. 3 schematically illustrates a part of a cross-section taken along A-A in FIG. 2.

Figure 4:
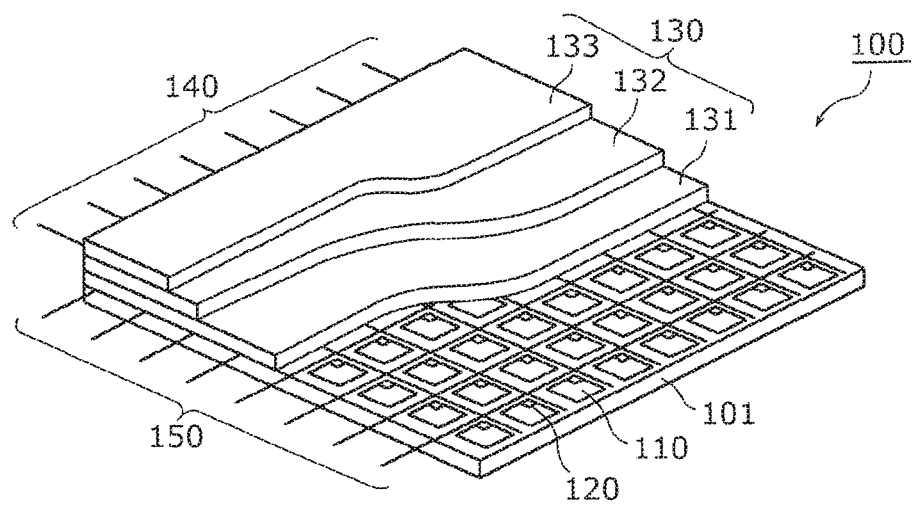
FIG. 4 is a partial cutaway perspective view of an EL substrate according to the embodiment.

FIG. 4 is a partial cutaway perspective view of an EL substrate 100 according to the embodiment.

Figure 5:
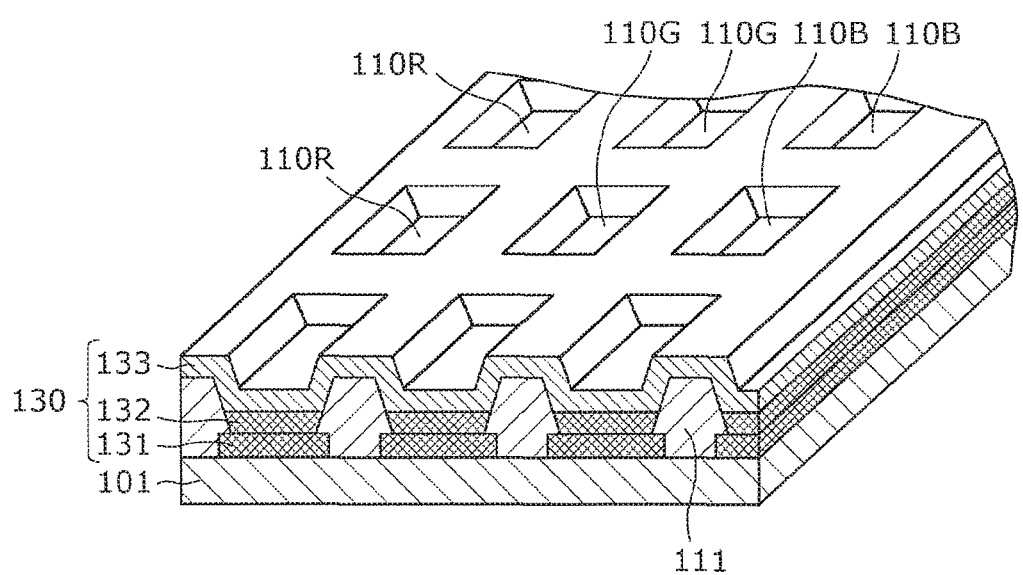
FIG. 5 is a perspective view illustrating examples of pixel banks of the EL substrate according to the embodiment.

FIG. 5 is a perspective view illustrating examples of pixel banks of the EL substrate 100 according to the embodiment.

As illustrated in FIG. 3, the organic EL panel 10 includes the EL substrate 100, a CF substrate 200, and a sealing resin layer 180a between the EL substrate 100 and the CF substrate 200.

Note that the organic EL panel 10 according to the present embodiment is a top emission organic EL display panel, and the CF substrate 200 disposed on the display surface side has a transparent glass substrate as a base material.

Specifically, the CF substrate 200 has a configuration in which R (red), G (green), and B (blue) color filters (not illustrated) are disposed on the upper surface of the glass substrate as viewed in FIG. 3.

The EL substrate 100 has organic EL elements 130 stacked on a thin film transistor (TFT) substrate (TFT array substrate) 101, and the surface of the EL substrate 100 on the organic EL elements 130 side is sealed with sealing resin 180.

Specifically, the organic EL panel 10 according to the present embodiment includes: the EL substrate 100 that includes the TFT substrate 101 and the organic EL elements 130 stacked on the TFT substrate 101; and the CF substrate 200 disposed in a position opposed to the EL substrate 100 with the organic EL element 130 and a sealing resin layer 180a between the CF substrate 200 and the TFT substrate 101. Note that the TFT substrate 101 is an example of a first substrate, and the CF substrate 200 is an example of a second substrate.

In addition, in the present embodiment, a dam portion 160 is formed along edges of the inner surface (upper surface in FIG. 3) of the CF substrate 200, and the sealing resin layer 180a is formed by applying the sealing resin 180 to the region surrounded by the dam portion 160.

The dam portion 160 is formed with resin containing a granular material which functions as a spacer that defines the space between the CF substrate 200 and the EL substrate 100.

A description of a technique of applying the sealing resin 180 in the present embodiment is given later, with reference to FIGS. 7A to 13.

More specifically, the EL substrate 100 according to the present embodiment has a structure in which the TFT substrate 101 which includes a plurality of thin-film transistors disposed and the organic EL elements (light emitting units) 130 are stacked, as illustrated in FIG. 4. Note that FIGS. 4 and 5 illustrate the EL substrate 100 such that the organic EL elements 130 are located higher.

The organic EL elements 130 each include an anode 131 which is a lower electrode, an EL layer 132 which is a light emitting layer that includes organic material, and a negative electrode 133 which is a transparent upper electrode.

The TFT substrate 101 has a structure in which various elements, such as a gate electrode, are stacked above a glass substrate, for example.

Specifically, the organic EL panel 10 has a structure in which the organic EL elements 130, for instance, are between the two glass substrates (the glass substrate of the TFT substrate 101 and the glass substrate of the CF substrate 200), as a whole. The thickness of the organic EL panel 10 having such a structure is about 0.5 mm to 1.5 mm, for example.

A plurality of pixels 110 are disposed in matrix form on the TFT substrate 101, and each pixel 110 includes a pixel circuit 120.

The organic EL elements 130 are formed in one-to-one correspondence with the plurality of pixels 110, and the pixel circuits 120 of the pixels 110 control light emission of the organic EL elements 130. The organic EL elements 130 are formed on an interlayer insulation film (flattening film) formed so as to cover the plurality of thin-film transistors.

In addition, the organic EL elements 130 each have a structure in which the EL layer 132 is disposed between the anode 131 and the negative electrode 133. A positive hole transport layer is further formed and stacked between the anode 131 and the EL layer 132, and an electron transport layer is further formed and stacked between the EL layer 132 and the negative electrode 133. Note that another organic functional layer may be provided between the anode 131 and the negative electrode 133.

The pixel circuits 120 control the drive of the pixels 110. In addition, a plurality of gate wires (scanning lines) 140 disposed in the row direction of the pixels 110, a plurality of source wires (signal wires) 150 disposed in the column direction of the pixels 110 so as to intersect the gate wires 140, and a plurality of power supply wires (omitted in FIG. 4) disposed in parallel with the source wires 150b are formed on the TFT substrate 101. The pixels 110 are separated by the gate wires 140 and the source wires 150 which are orthogonal to one another, for example.

The gate wires 140 are each connected to one row of gate electrodes of thin-film transistors which operate as switching elements included in the pixel circuits 120. The source wires 150 are each connected to one column of source electrodes of thin-film transistors which operate as switching elements included in the pixel circuits 120. The power supply wires are each connected to one column of drain electrodes of thin-film transistors which operate as driver elements included in the pixel circuits 120.

As illustrated in FIG. 5, the pixels 110 of the organic EL panel 10 include three-color (red, green, blue) sub pixels 110R, 110G, and 110B. The sub pixels 110R, 110G, and 110B are disposed in matrix form on the display surface.

The sub pixels 110R, 110G, and 110B are separated from one another by banks 111. The banks 111 are formed to make a lattice such that protruding lines extending in parallel with the gate wires 140 and protruding lines extending in parallel with the source wires 150 intersect with one another. Portions surrounded by the protruding lines (in other words, openings of the banks 111) and the sub pixels 110R, 110G, and 110B are in one-to-one correspondence. Note that although the banks 111 are pixel banks in the present embodiment, the banks 111 may be line banks.

The anode 131 is formed for each of the sub pixels 110R and 110G and 110B, on the interlayer insulation film (flattening film) on the TFT substrate 101 and inside the openings of the banks 111. Similarly, the EL layer 132 is formed for the sub pixels 110R and 110G and 110B, on the anode 131 and inside the openings of the banks 111. The transparent negative electrode 133 is formed in a connected manner above the banks 111 so as to cover the entire EL layer 132 (all the sub pixels 110R, 110G, and 110B).

Furthermore, the pixel circuits 120 are provided in one-to-one correspondence with the sub pixels 110R, 110G, and 110B, and the sub pixels 110R, 110G, and 110B and the pixel circuits 120 in one-to-one correspondence therewith are electrically connected by contact holes and relay electrodes. Note that the sub pixels 110R, 110G, and 110B have the same configurations, except that the portions of the EL layer 132 emit light having different colors.

Figure 6:
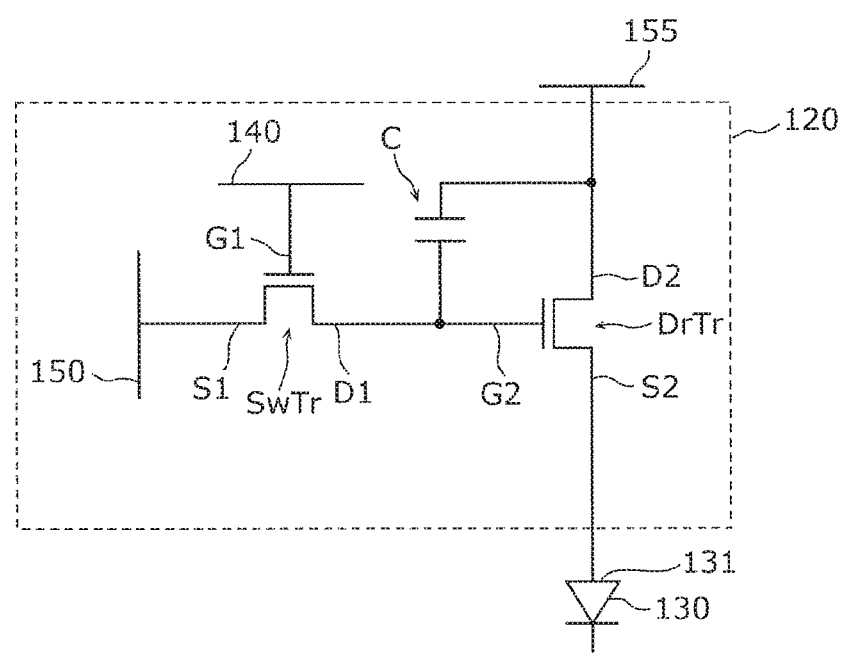
FIG. 6 is an electrical diagram illustrating a configuration of a pixel circuit of the EL substrate according to the embodiment.

Here, a description is given of a circuit configuration of the pixel circuits 120 of the pixels 110 with reference to FIG. 6. FIG. 6 is an electrical diagram illustrating the configuration of the pixel circuits 120 in the organic EL panel 10 according to the embodiment.

As illustrated in FIG. 6, each pixel circuit 120 includes a thin-film transistor SwTr which operates as a switching element, a thin-film transistor DrTr which operates as a driver element, and a capacitor C which stores data to be displayed using the corresponding pixel 110. In the present embodiment, the thin-film transistor SwTr is a switching transistor for selecting a pixel 110, and the thin-film transistor DrTr is a drive transistor for driving the organic EL element 130.

The thin-film transistor SwTr includes a gate electrode G1 connected to the gate wire 140, a source electrode S1 connected to the source wire 150, a drain electrode D1 connected to a capacitor C and a gate electrode G2 of the thin-film transistor DrTr, and a semiconductor film (not illustrated). If a predetermined voltage is applied to the gate wire 140 and the source wire 150 which are connected to the thin-film transistor SwTr, the voltage applied to the source wire 150 is stored as a data voltage into the capacitor C.

The thin-film transistor DrTr includes the gate electrode G2 connected to the drain electrode D1 of the thin-film transistor SwTr and the capacitor C, a drain electrode D2 connected to a power supply wire 155 and the capacitor C, a source electrode S2 connected to the anode 131 of the organic EL element 130, and a semiconductor film (not illustrated). The thin-film transistor DrTr supplies, from the power supply wire 155 to the anode 131 of the organic EL element 130 via the source electrode S2, a current corresponding to the data voltage stored in the capacitor C. Accordingly, a drive current flows from the anode 131 to the negative electrode 133 in the organic EL element 130, thus causing the EL layer 132 to emit light.

Note that the active matrix for controlling display for each of the pixels 110 located at the intersections of the gate wires 140 and the source wires 150 is employed for the organic EL panel 10 having the above configuration. In this manner, the thin-film transistors SwTr and DrTr of each of the pixels 110 (the sub pixels 110R, 110G, and 110B) cause the corresponding organic EL element 130 to selectively emit light, thus displaying a desired image.

The following describes a method for manufacturing the organic EL panel 10 having the above configuration, focusing on a matter about a process of applying the sealing resin 180 which is a feature of the present embodiment, with reference to FIGS. 7A to 13.

1-3. Method for Manufacturing Organic EL Panel

Figure 7A:
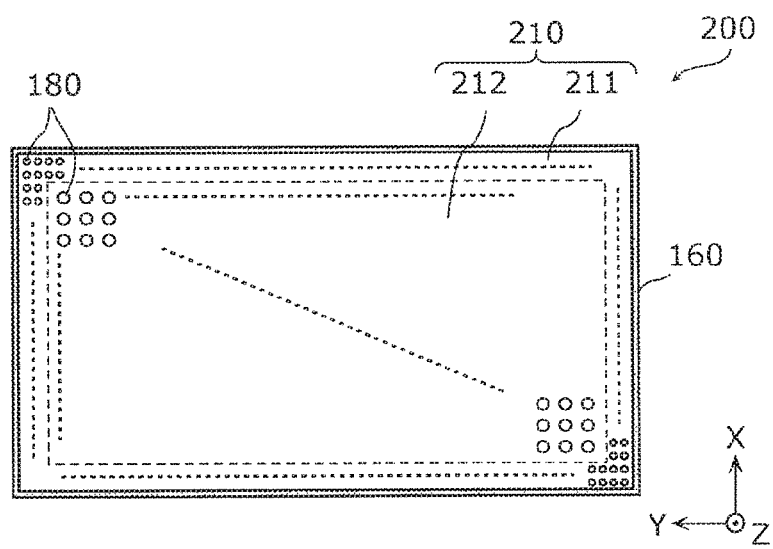
FIG. 7A is a plan view illustrating features of a process of applying sealing resin according to the embodiment.

The first describes a process of applying the sealing resin 180 according to the present embodiment in outline with reference to FIG. 7A.

1-3-1. Outline of Process of Applying Sealing Resin

FIG. 7A is a plan view illustrating a feature of the process of applying the sealing resin 180 according to the embodiment.

Figure 7B:
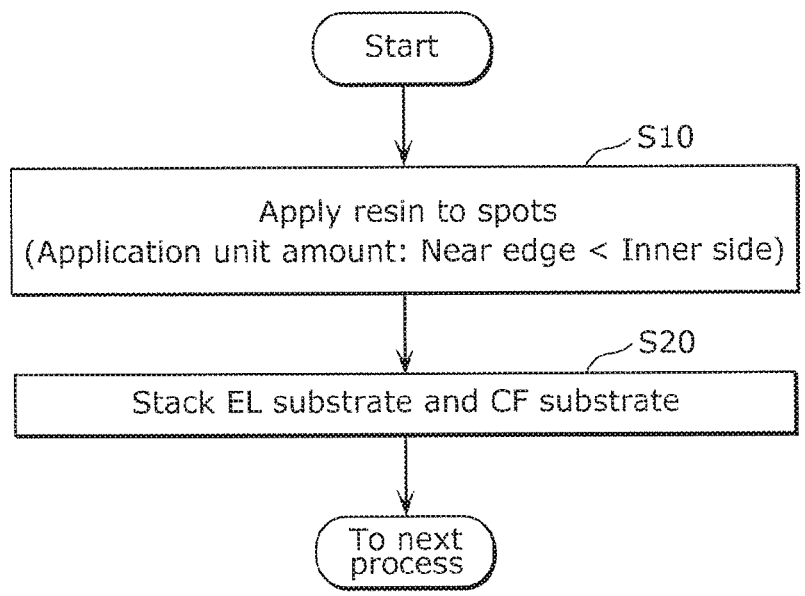
FIG. 7B is a flowchart illustrating a basic flow of a method for manufacturing the organic EL panel according to the embodiment.

FIG. 7B is a flowchart illustrating a basic flow of a method for manufacturing an organic EL panel according to the embodiment.

In the application process according to the present embodiment, the sealing resin 180 is applied to a plurality of spots on the inner surface of the CF substrate 200 as illustrated in FIG. 7A. Specifically, a technique of discretely applying the sealing resin 180 onto the inner surface of the CF substrate 200 is employed.

Note that the organic EL panel 10 according to the present embodiment is a top emission panel which displays an image on the CF substrate 200, and thus colorless transparent resin is employed as the sealing resin 180. Specifically, a resin is employed which can be intentionally cured after the resin is applied, such as ultraviolet curable epoxy resin, ultraviolet curable acrylic resin, or thermosetting epoxy resin.

As illustrated in FIG. 7B, the method for manufacturing the organic EL panel 10 according to the present embodiment includes an application process (S10) and a stack process (S20).

In the application process (S10), the sealing resin 180 for forming the sealing resin layer 180a is applied to a plurality of spots on an application target surface of one of the EL substrate 100 and the CF substrate 200, the application target surface being a surface to which the sealing resin 180 is to be applied. In the present embodiment, the sealing resin 180 is applied to a plurality of spots on an application target surface 210 of the CF substrate 200.

In the stack process (S20), the EL substrate 100 and the CF substrate 200 are stacked one on top of the other after the application process.

The application process (S10) according to the present embodiment further has a feature that the amount of the sealing resin 180 applied to a spot near an edge of the application target surface 210 is less than the amount of the sealing resin 180 applied to a spot further inward than the spot near the edge.

Specifically, in the application process (S10), among the amounts of the sealing resin 180 applied to two spots on the application target surface 210, the amount of the sealing resin 180 applied to a spot near an edge of the application target surface 210 is less than the amount of the sealing resin 180 applied to a spot distant from an edge of the application target surface 210.

Specifically, in the present embodiment, as illustrated in FIG. 7A, the inner surface of the CF substrate 200 (the surface on the EL substrate 100 side) is handled as a surface (application target surface) to which the sealing resin 180 for forming the sealing resin layer 180a is to be applied.

More specifically, the dam portion 160 formed by linearly applying resin is provided along the edges of the inner surface of the CF substrate 200, and the inside region surrounded by the dam portion 160 is the application target surface 210.

The application target surface 210 is divided into an edge region 211 and an inner region 212 which is further inward than the edge region 211. Note that the inner region 212 in the present embodiment is an example of a first inner region.

The edge region 211 is a region in a predetermined area near the edges of the CF substrate 200 (the edges of the application target surface 210). For example, if the organic EL panel 10 has about a 40 inch to 50 inch screen size, an about 10 mm to 30 mm region from the edges of the CF substrate 200 is handled as the edge region 211. In addition, the whole region further inward than the edge region 211 is handled as the inner region 212. Note that the width of the dam portion 160 perpendicular to the longitudinal direction in plan view is about 0.5 mm to 1.5 mm, for example.

In the present embodiment, in the edge region 211 and the inner region 212 divided as described above, an amount (first amount) of the sealing resin 180 applied to a spot in the edge region 211 is less than an amount (second amount) of the sealing resin 180 applied to a spot in the inner region 212.

In order to thus apply the sealing resin 180 to a plurality of spots on the application target surface 210, for example, an application device is used which applies the sealing resin 180 by discharging the sealing resin 180 dropwise through one or more nozzles.

1-3-2. Example of Configuration of Application Device

Figure 8:
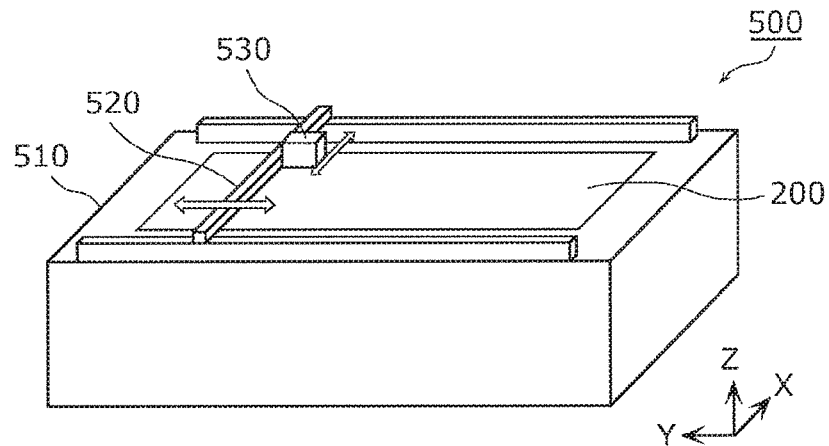
FIG. 8 is a perspective view illustrating a schematic configuration of an application device for use in manufacture of the organic EL panel according to the embodiment.

FIG. 8 is a perspective view illustrating a schematic configuration of an application device 500 for use in manufacture of the organic EL panel 10 according to the embodiment.

The application device 500 illustrated in FIG. 8 includes a table 510 which holds the CF substrate 200 in an orientation parallel to the XY plane, and a head 530 which applies the sealing resin 180 to the CF substrate 200 held on the table 510.

The head 530 is movable in the X axial direction along a beam 520 elongated in the X axial direction. The beam 520 is movable in the Y axial direction relative to the table 510. In this manner, the head 530 is movable in directions parallel to the XY plane. In addition, the head 530 includes one or more nozzles for discharging the sealing resin 180 dropwise.

In the application device 500 having the above configuration, the head 530 repeats movement in directions parallel to the XY plane, stop, and discharge of the sealing resin 180, thus applying the sealing resin 180 to a plurality of spots on the application target surface 210 of the CF substrate 200.

For example, a syringe-extrusion resin discharge device is employed as a mechanism of the head 530, for discharging drops of the sealing resin 180.

Figure 9:
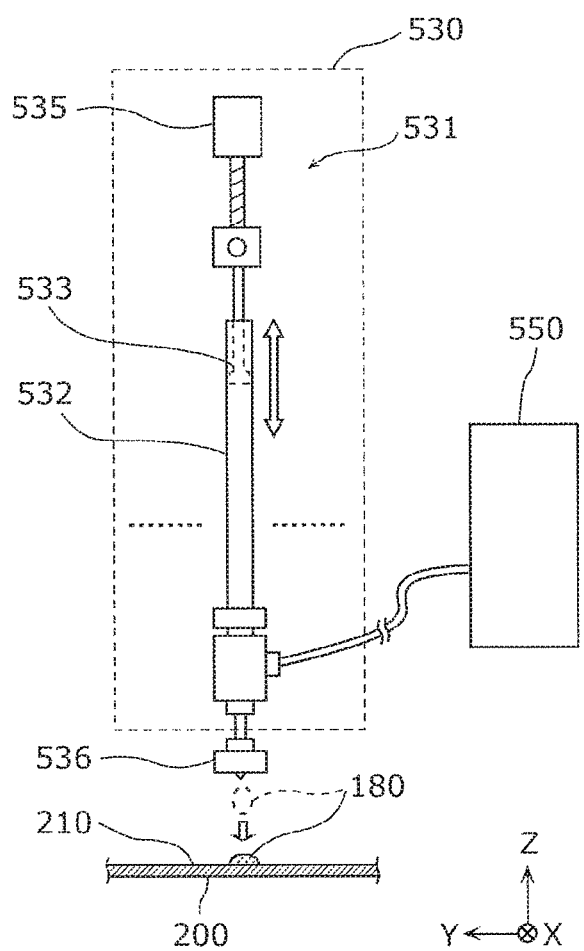
FIG. 9 illustrates a schematic configuration of a resin discharge device for use in application of sealing resin according to the embodiment.

FIG. 9 illustrates a schematic configuration of a resin discharge device 531 for use in the application of the sealing resin 180 in the embodiment.

The resin discharge device 531 according to the present embodiment discharges the sealing resin 180 using the syringe extrusion method.

The resin discharge device 531 includes a syringe 532 which is a cylinder in which the sealing resin 180 is contained, a plunger 533 which is inserted in the syringe 532 and moves in the axial direction (vertical direction in FIG. 9) of the syringe 532, and a motor 535 which drives the movement of the plunger 533.

For example, a ball screw which converts rotation of the shaft of the motor 535 into linear motion of the plunger 533 drives the movement of the plunger 533. In addition, the syringe 532 includes, at the lower end thereof, a nozzle 536 having a hole for discharging the sealing resin 180 dropwise.

Specifically, in the resin discharge device 531, the plunger 533 applies pressure to the sealing resin 180 contained inside the syringe 532, thus discharging the sealing resin 180 dropwise. In addition, by the plunger 533 moving upward, the sealing resin 180 is supplied to the syringe 532 from a tank 550 connected to the resin discharge device 531.

The head 530 includes one or more resin discharge devices 531 having the above configuration. For example, the head 530 includes five resin discharge devices 531 aligned in the Y axial direction.

For example, a controller (not illustrated) included in the application device 500 controls movement of the head 530 and operation of the one or more resin discharge devices 531.

In the application device 500, drops of the sealing resin 180 are discharged from the resin discharge device 531 above a plurality of spots on the application target surface 210 (see FIG. 7A) of the CF substrate 200, according to the control of the controller. This applies the sealing resin 180 to each of the plurality of spots.

Note that the controller is achieved by a computer which includes a central processing unit (CPU), a storage device, and an interface for inputting and outputting information, for example. The controller executes a program for controlling application operation of the head 530, which allows the application device 500 to apply the sealing resin 180 to a plurality of spots on the application target surface 210.

If the head 530 includes a plurality of resin discharge devices 531, the resin discharge devices 531 simultaneously discharge the sealing resin 180, thus simultaneously applying the sealing resin 180 to a plurality of spots on the application target surface 210 (see FIG. 7A).

In the present embodiment, the application device 500 is controlled such that the sealing resin 180 is applied in different manners to the edge region 211 and the inner region 212 of the application target surface 210, as illustrated in FIG. 7A.

The following describes a specific example of the process of applying the sealing resin 180 according to the present embodiment, with reference to FIGS. 10 to 13.

1-3-3. Specific Example of Process of Applying Sealing Resin

Figure 10:
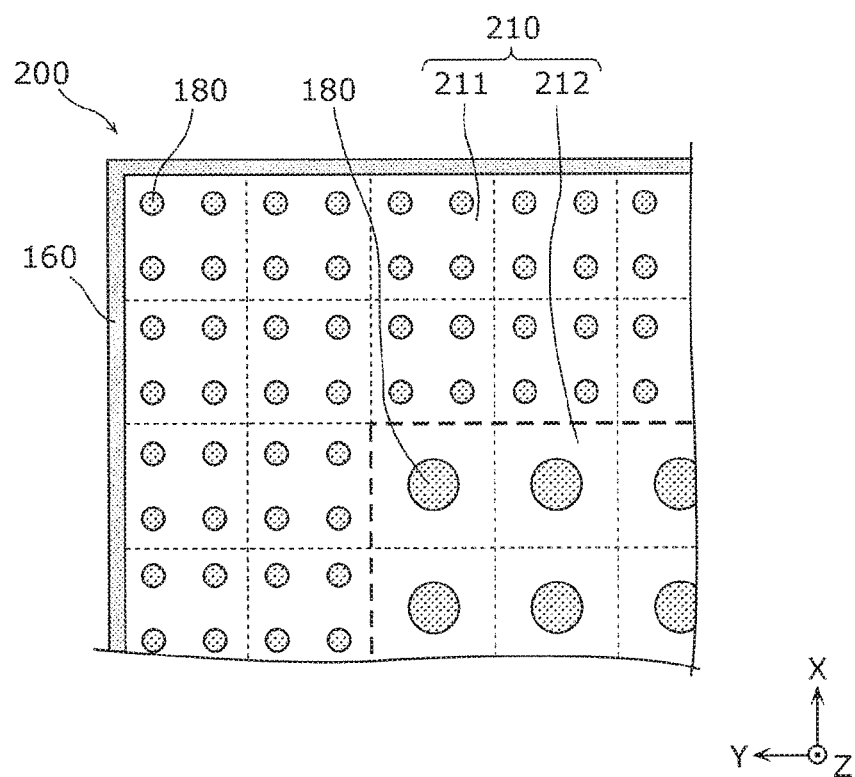
FIG. 10 is a plan view illustrating a distribution of application spots on an application target surface according to the embodiment.

FIG. 10 is a plan view illustrating a distribution of application spots on the application target surface 210 according to the embodiment. Note that FIG. 10 corresponds to an enlarged view of an upper left portion of the CF substrate 200 illustrated in FIG. 7A.

Figure 11:
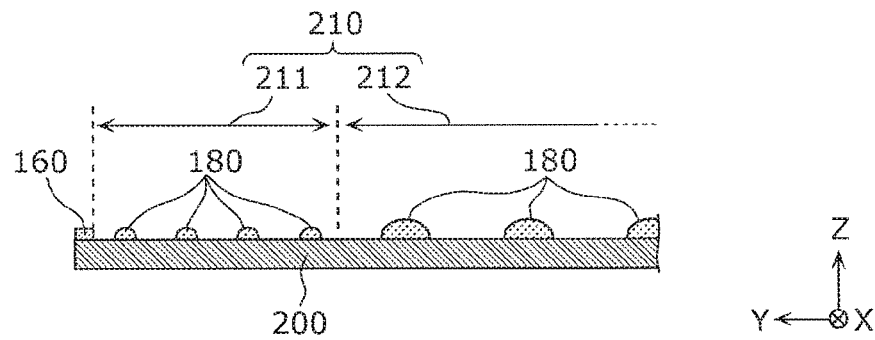
FIG. 11 is a schematic diagram illustrating a cross section corresponding to FIG. 10.
Figure 12:
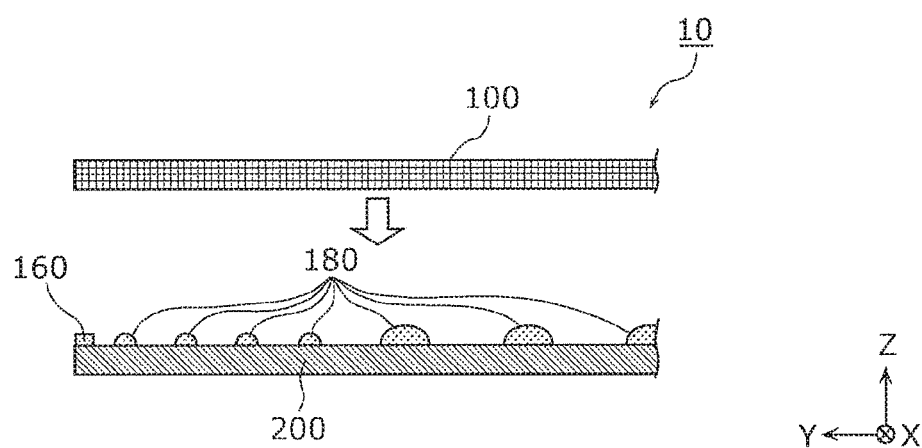
FIG. 12 is a cross-sectional schematic diagram illustrating a stack process executed after the application of sealing resin.
Figure 13:
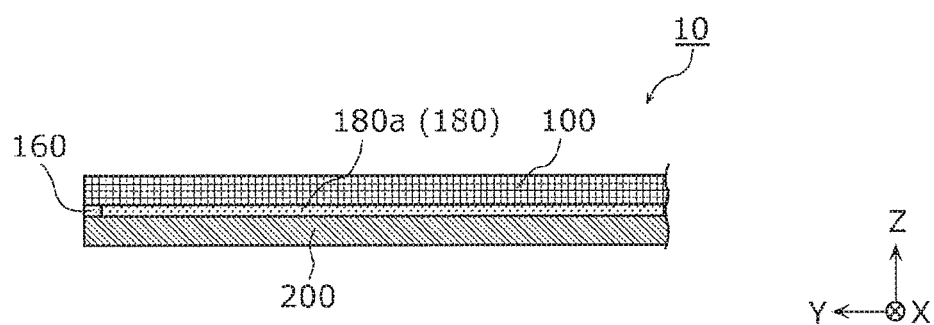
FIG. 13 is a cross-sectional schematic diagram of the organic EL panel which has been subjected to, for instance, a pressure application process and a curing process after the stack process.

FIG. 11 is a cross-sectional schematic diagram corresponding to FIG. 10. FIG. 12 is a cross-sectional schematic diagram illustrating the stack process executed after the sealing resin 180 is applied. FIG. 13 is a cross-sectional schematic diagram of the organic EL panel 10 which has been subjected to the stack process, and thereafter a pressure application process and a curing process.

A description of, for instance, the process of applying the sealing resin 180 and the process of stacking the CF substrate 200 and the EL substrate 100 which constitute a part of the method for manufacturing the organic EL panel 10 is given with reference to FIGS. 10 to 13.

The application process according to the present embodiment includes an edge application process and a first inner application process. Note that the following describes the edge application process and the first inner application process in the state order, yet either one of the edge application process and the first inner application process is executed prior to the other. In addition, at least a part of the edge application process and the first inner application process may be executed simultaneously.

In the edge application process, the sealing resin 180 of a predetermined amount (first amount) is applied to each of spots in the edge region 211 on the application target surface 210.

In addition, in the first inner application process, the sealing resin 180 of a second amount greater than the first amount is applied to each of one or more spots in the inner region 212 on the application target surface 210.

Specifically, as illustrated in FIGS. 10 and 11, an amount (first amount) of the sealing resin 180 applied to a spot near an edge of the application target surface 210 is less than an amount (second amount) of the sealing resin 180 applied to a spot further inward than the spot near the edge.

In addition, a first application spot count which indicates how many spots per unit area the sealing resin 180 of the first amount is applied is greater than a second application spot count which indicates how many spots per unit area the sealing resin 180 of the second amount is applied. Specifically, if the number of application spots in the edge region 211 and the number of application spots in the inner region 212 are compared on the per unit area basis, the number of application spots in the edge region 211 is greater.

For example, as illustrated in FIG. 10, if the area of one rectangular region surrounded by the fine dotted line is a unit area, the first application spot count is "4", and the second application spot count is "1." In this case, for example, the second amount is 4 times the first amount. Specifically, the amount of the sealing resin 180 applied is controlled such that a total amount of the sealing resin 180 applied per unit area is a fixed amount.

Accordingly, in the present embodiment, a small unit amount of the sealing resin 180 is applied to a large number of spots (per unit area) in the edge region 211, or specifically, a region near the edges (rim) of the application target surface 210 to which the sealing resin 180 is to be applied. In contrast, a large unit amount of the sealing resin 180 is applied to a small number of spots (per unit area) in a region distant from the edges (rim) of the application target surface 210.

As described above, the sealing resin 180 is applied to the edge region 211 and the inner region 212 in different manners, and thus the sealing resin layer 180a is efficiently formed with high accuracy.

Specifically, in the stack process (see FIG. 12) executed after the application process described above, if the EL substrate 100 is stacked on the CF substrate 200, the sealing resin 180 at each application spot in the edge region 211 in plan view expands between the CF substrate 200 and the EL substrate 100.

In addition, in the stack process, pressure is applied to the EL substrate 100 and the CF substrate 200, which are disposed opposed to one another and having the sealing resin 180 therebetween, in a vacuum chamber where atmospheric pressure is adjusted to 10 pa or less, for example (pressure application process). In this manner, the sealing resin 180 between the EL substrate 100 and the CF substrate 200 is deaerated, which makes the region surrounded by the dam portion 160 a closed region. After that, the pressure inside the vacuum chamber is increased to atmospheric pressure. The EL substrate 100 and the CF substrate 200 are pressed by the pressure difference between the vacuum and atmospheric pressure. As a result, the sealing resin 180 applied to a plurality of spots on the application target surface 210 is further expanded.

Note that resin which forms the dam portion 160 is, for example, is the same resin (such as ultraviolet curable resin) as that of the sealing resin 180, and is not yet cured when the pressure is applied as described above. The resin which forms the dam portion 160, however, includes, for example, a plurality of spherical silica particles (having the diameter of about 5 μm to 50 μm, for example) as spacers. Consequently, the distance between the CF substrate 200 and the EL substrate 100 at the edges of the application target surface 210 is limited to a predetermined distance depending on the size of the spherical silica particles.

Accordingly, when the CF substrate 200 and the EL substrate 100 come close to one another until the distance at the edges of the application target surface 210 is decreased to a predetermined distance, concentric expansion of the sealing resin 180 from each of the application spots in the edge region 211 is limited in a comparatively small area. This is because the amount of resin applied (the first amount) to each application spot is comparatively small in the present embodiment.

Specifically, the sealing resin 180 expands such that a group of small circles of the sealing resin 180 covers the edge region 211 (or in other words, a region near the dam portion 160), and thus the sealing resin 180 in an amount which causes protrusion of the sealing resin 180 beyond the dam portion 160 is prevented from surging toward the dam portion 160. As a result, the sealing resin 180 is prevented from protruding beyond the edges of the CF substrate 200.

In addition, the number of application spots per unit area is increased in the edge region 211 while the amount (first amount) of the sealing resin 180 applied to each application spot in the edge region 211 is reduced, in order to prevent the sealing resin 180 from protruding beyond an edge. In this manner, occurrence of insufficiency of the sealing resin 180, or in other words, generation of a gap in the sealing resin layer 180a is prevented at and near the dam portion 160.

In addition, a problem of protrusion of the sealing resin 180, which is likely to occur in the edge region 211, does not arise in the inner region 212, and thus the sealing resin 180 of a comparatively large unit amount (the second amount) is applied to a small number of spots (per unit area).

To summarize the above application process, a small unit amount of the sealing resin 180 is applied to a plurality of spots densely in the edge region 211, whereas in the inner region 212, a large unit amount of the sealing resin 180 is applied to a plurality of spots less densely. Specifically, the sealing resin 180 is applied with accuracy prioritized in the edge region 211, whereas in the inner region 212, the sealing resin 180 is applied with efficiency prioritized.

This prevents protrusion of the sealing resin 180 and generation of a gap in the edge region 211, and allows the sealing resin 180 to be applied efficiently to the inner region 212.

Here, the inner region 212 is an area of the application target surface 210, which is comparatively distant from the dam portion 160 and which is not substantially influenced by the dam portion 160, with respect to a distance between the CF substrate 200 and the EL substrate 100.

Thus, the flexibility of the thickness of the sealing resin 180 in the inner region 212 is comparatively high. Accordingly, even if the sealing resin 180 is applied with efficiency prioritized as described above, a problem that decreases the accuracy of forming the sealing resin layer 180a does not substantially occur.

Note that the application process, the stack process, and the pressure application process described above are conducted, and thereafter the organic EL panel 10 is irradiated with ultraviolet rays (curing process) from the CF substrate 200 side, for example. This cures the sealing resin 180 and the dam portion 160 which are made of ultraviolet curable resin, and forms the sealing resin layer 180a between the CF substrate 200 and the EL substrate 100, as illustrated in FIG. 13.

1-4. Advantageous Effects and Others

As described above, the image display device 1 according to the present embodiment includes the organic EL panel 10. The organic EL panel 10 has a structure where the EL substrate 100 and the CF substrate 200 are disposed with the sealing resin layer 180a therebetween.

A method for manufacturing the organic EL panel 10 includes the process of applying the sealing resin 180 to a plurality of spots on the application target surface 210 of the CF substrate 200. In the application process, the amount of the sealing resin 180 applied to a spot near an edge of the application target surface 210 is less than the amount of the sealing resin 180 applied to a spot further inward than the spot near the edge.

In this manner, the sealing resin 180 is applied in small amounts in an area near the edges of the application target surface 210 where a problem of protrusion of the sealing resin 180 easily arises. Furthermore, in an area where a problem of the protrusion of the sealing resin 180 does not arise, the sealing resin 180 can be efficiently applied in comparatively large amounts.

Specifically, the method for manufacturing the organic EL panel 10 according to the present embodiment allows the sealing resin layer 180a disposed between the CF substrate 200 (second substrate) and the EL substrate 100 which includes the TFT substrate 101 (first substrate) and the organic EL elements 130 to be formed with high accuracy. In addition, the method prevents a fall of working efficiency of the entire process of applying the sealing resin 180 due to forming the sealing resin layer 180a with high accuracy.

In addition, the application process according to the present embodiment includes the edge application process and the first inner application process, and as described above, in the edge application process, a small unit amount (first amount) of the sealing resin 180 is applied to a large number of spots (per unit area) in the edge region 211. In addition, in the first inner application process, a large unit amount (second amount) of the sealing resin 180 is applied to a small number of spots (per unit area) in the inner region 212.

Specifically, the application of the sealing resin 180 to a plurality of spots is executed in the edge region 211 with accuracy prioritized, and in the inner region 212, the application of the sealing resin 180 to a plurality of spots is executed with efficiency prioritized. Furthermore, the amount of the sealing resin 180 applied is controlled such that a total amount of the sealing resin 180 applied per unit area is a fixed amount over the application target surface 210.

This allows highly accurate formation of the sealing resin layer 180a to be executed more efficiently.

In the application process, the plunger 533 applies pressure to the sealing resin 180 contained in the syringe 532, to discharge the sealing resin 180 dropwise, and accordingly, the sealing resin 180 is applied to a plurality of spots on the application target surface 210.

Specifically, the application of the sealing resin 180 is executed using the syringe extrusion method. Accordingly, the following effects are achieved.

The syringe 532 has capacity for containing (keeping) the sealing resin 180 necessary to be applied to one CF substrate 200, for example. The volume of a drop formed by one discharge from the syringe 532 as described above is determined by a distance in which the plunger 533 moves toward the nozzle 536 (see FIG. 9).

Accordingly, a comparatively wide range of the amount of the sealing resin 180 discharged one time (the application amount to one spot) can be set.

In this manner, for example, the sealing resin 180 is applied more densely to a plurality of spots in the edge region 211, and application of the sealing resin 180 to one or more spots in the inner region 212 can be more efficiently executed.

Note that in the method for manufacturing the organic EL panel 10, a process different from the application process described in the above embodiment may be executed when the sealing resin 180 is applied to the application target surface 210.

In view of this, the following describes a variation of the application process applicable as a part of the method for manufacturing the organic EL panel 10, focusing on a difference from the above embodiment.

2. Variation of Embodiment

Figure 14:
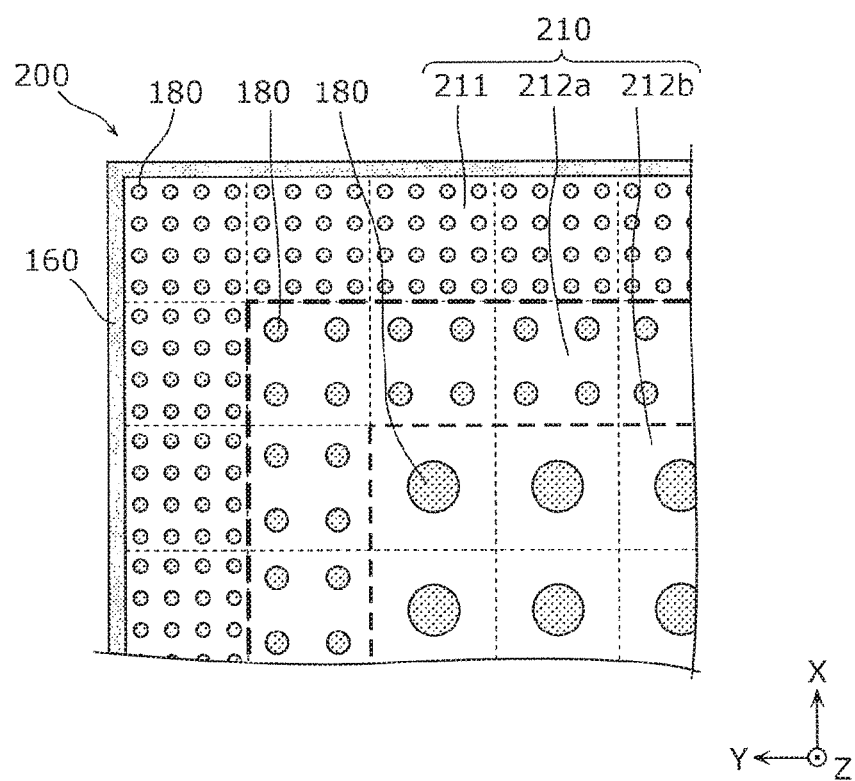
FIG. 14 is a plan view illustrating a distribution of application spots on the application target surface according to a variation of the embodiment.

FIG. 14 is a plan view illustrating a distribution of application spots on the application target surface 210 according to a variation of the embodiment.

The application target surface 210 illustrated in FIG. 14 is sectioned into three areas, namely, an edge region 211, a first inner region 212a, and a second inner region 212b.

The second inner region 212b is a region of the application target surface 210, which is further inward than the first inner region 212a.

In addition, in this variation, a unit amount of the sealing resin 180 applied to the edge region 211 first amount), a unit amount of the sealing resin 180 applied to the first inner region 212a (second amount), and a unit amount of the sealing resin 180 applied to the second inner region 212b (third amount) are greater in the stated order.

Specifically, the amount (application unit amount) of the sealing resin 180 applied to each of a plurality of spots on the application target surface 210 decreases with a decrease in the distance from an edge of the application target surface 210. In other words, the application unit amount increases with distance from the edge of the application target surface 210.

In order to achieve the application of the sealing resin 180 in such a manner, the application process in the above embodiment may further include a process as below. Specifically, the application process further includes a second inner side application process of applying the sealing resin 180 of the third amount greater than the second amount to each of one or more spots in the second inner region 212b which is a region of the application target surface 210 further inward than the first inner region 212a. In addition, a second application spot count which indicates how many spots per unit area the sealing resin 180 of the second amount is applied is greater than a third application spot count which indicates how many spots per unit area the sealing resin 180 of the third amount is applied.

Specifically, in this variation, if the area of one rectangular area surrounded by the fine dotted line is a unit area, the first application spot count is "16", the second application spot count is "4", and the third application spot count is "1." Note that in this case, the third amount is 16 times the first amount, and the second amount is 4 times the first amount. Specifically, the amount of the sealing resin 180 applied is controlled such that the total amount of the sealing resin 180 applied per unit area is a fixed amount.

Accordingly, in this variation, the application unit amount decreases with a decrease in the distance from the edge of the application target surface 210, whereas the number of application spots per unit area increases with a decrease in the distance from the edge of the application target surface 210.

In this manner, for example, the sealing resin 180 is densely applied to many spots in the edge region 211 closest to the dam portion 160, to minimize excessiveness and insufficiency of the sealing resin 180.

In the first inner region 212a that is second closest to the dam portion 160, the sealing resin 180 is applied to a plurality of spots in small amounts, for example, so as not to excessively supply the sealing resin 180 to the edge region 211.

Furthermore, a problem such as the protrusion of the sealing resin 180 does not occur in the second inner region 212b that is most distant from the dam portion 160, and thus the sealing resin 180 is applied to a small number of spots (per unit area) in largest amounts.

In this manner, the application target surface 210 may be sectioned into three or more areas according to the distance from the edges (the distance from the dam portion 160). In this case, the application unit amount is decreased with a decrease in the distance from the edge of the application target surface 210 as described above. Furthermore, the number of application spots per unit area is increased with a decrease in the distance from the edge of the application target surface 210.

In this manner, efficiency of the work of applying the sealing resin 180 is increased while forming the sealing resin layer 180a with higher accuracy.

Note that working efficiency and whether the sealing resin layer 180a has a problem, for instance, are examined for each of the numbers of sectioned regions by, for example, a simulation or a test conducted using the actual device, and then how many regions the application target surface 210 is to be sectioned may be determined according to the results. In addition, the size of each region, for instance, may be determined as appropriate by, for example, a simulation or a test conducted using the actual device.

Note that if the application process includes the edge application process, the first inner application process, and the second inner side application process, there is no particular limitation to the order in which the three processes are executed. In addition, at least a portion of two or more of the three processes may be executed simultaneously.

3. Other Embodiments

The above has described the embodiment and the variation thereof as examples of the technique disclosed in this application. However, the technique according to the present disclosure is not limited to these, and is also applicable to embodiments as a result of appropriate change, replacement, addition, and omission. Furthermore, elements described in the above embodiment and the variation can be combined to form a new embodiment. The following describes other embodiments as examples.

For example, in the embodiment, the surface (inner surface) of the CF substrate 200 on the color filter side is handled as the application target surface 210. Thus, the sealing resin 180 is applied to the CF substrate 200, and the EL substrate 100 is staked thereon. However, the surface of the EL substrate 100 on the organic EL element 130 side may be handled as the application target surface. Thus, the sealing resin 180 is applied to the EL substrate 100, and the CF substrate 200 may be stacked thereon.

Even in this case, the sealing resin 180 applied to a plurality of spots on the application target surface expands between the EL substrate 100 and the CF substrate 200, which is the same, and thus the sealing resin layer 180a can be formed with high accuracy by the application process in the above embodiment or variation.

In addition, the method of applying the sealing resin 180 is the syringe extrusion method in the above embodiment (see FIG. 9). However, the method of applying the sealing resin 180 is not limited to the syringe extrusion method. For example, a resin discharge device which discharges (drips) the sealing resin 180 by piezo drive may apply the sealing resin 180 to the CF substrate 200 or the EL substrate 100.

Specifically, if the device can change the amount of resin applied to one spot as illustrated in, for example, FIGS. 10 and 14, such a device can be employed as a device that applies the sealing resin 180 to the CF substrate 200 or the EL substrate 100 independently of the method of applying resin.

In addition, the sealing resin 180 may be applied to one spot on the application target surface 210 though discharging operation (dripping operation) multiple times, for example. Specifically, the sealing resin 180 in an amount necessary for the one spot may be obtained through discharging operation (dripping operation) multiple times.

For example, assume the case where the application process in the above embodiment or variation is executed using a resin discharge device with a small range of discharge. In this case, the resin discharge device may perform discharging operation multiple limes with respect to one spot on the application target surface 210, thus applying the sealing resin 180 of an amount for the one spot.

In addition, the method for manufacturing the organic EL panel 10 according to the embodiment and the variation described above is applicable not only to a method for manufacturing organic EL display panels which display images, but also as a method for manufacturing organic EL panels used as light sources of organic EL lights, for example.

In the above embodiment and variation, the amount of the sealing resin 180 applied is controlled such that a total amount of the sealing resin 180 applied per unit area is a fixed amount. However, such a total amount of the sealing resin 180 applied per unit area may not be a strictly fixed amount. Specifically, the total amount of the sealing resin 180 applied per unit area may be different for locations of the application target surface 210 within a range which does not allow occurrence of a problem such as generation of a gap in the sealing resin layer 180a.

In addition, if the screen size of the organic EL panel 10 is comparatively small, a region which includes the center of the application target surface 210 (the inner region 212 in the embodiment or the second inner region 212b in the variation) may have one application spot of the sealing resin 180, for example. Specifically, in a region comparatively distant from the edges of the application target surface 210, the sealing resin layer 180a may be formed by applying the sealing resin 180 having a comparatively large amount to one spot.

In addition, the organic EL panel 10 in the present embodiment may be achieved as a bottom emission organic EL display panel which displays an image on a glass substrate of the TFT substrate 101. In this case, the sealing resin 180 may not be colorless transparent resin. In addition, the substrate (second substrate) disposed in a position opposed to the EL substrate 100 (the first substrate) with the sealing resin layer 180a therebetween may not be a transparent glass substrate.

The above has described embodiments as examples of the technique according to the present disclosure. For the description, the accompanying drawings and the detailed description are provided.

Thus, the elements illustrated in the accompanying drawings and described in the detailed description may include not only elements necessary for addressing the problem, but also elements not necessarily required for addressing the problem, in order to illustrate the above technique. Accordingly, a fact that such unnecessarily required elements are illustrated in the accompanying drawings and described in the detailed description should not immediately lead to a determination that such unnecessarily required elements are required.

In addition, the embodiments described above are intended to illustrate the technique according to the present disclosure, and thus various changes, replacement, addition, omission, and the like can be performed within the scope of claims and equivalent thereof.

INDUSTRIAL APPLICABILITY

The present disclosure is applicable to organic EL panels included in image display devices. Specifically, the present disclosure is applicable to organic EL panels included in television receivers, monitor displays, digital signage, mobile terminals, tablet terminals, and table type displays. In addition, the present disclosure is also applicable to organic EL panels which serve as light sources of organic EL lights.

REFERENCE SIGNS LIST

1 Image display device
10 Organic EL panel
21 Chassis
21a Protrusion
30 Frame
40 Back cover
50, 51 Circuit board
100 EL substrate
101 TFT substrate
110 Pixel
110B, 110G, 110R Sub pixel
111 Bank
120 Pixel circuit
130 Organic EL element
131 Anode
132 EL layer
133 Negative electrode
140 Gate wire
150 Source wire
155 Power supply wire
160 Dam portion
180 Sealing resin
180a Sealing resin layer
200 CF substrate
210 Application target surface
211 Edge region
212 Inner region
212a First inner region
212b Second inner region
500 Application device
510 Table
520 Beam
530 Head
531 Resin discharge device
532 Syringe
533 Plunger
535 Motor
536 Nozzle
550 Tank

The invention claimed is:

1. A method for manufacturing an organic electroluminescent (EL) panel which includes: an EL substrate that includes a first substrate and an organic EL element stacked on the first substrate; and a second substrate disposed in a position opposed to the first substrate with the organic EL element and a resin layer between the second substrate and the first substrate, the method comprising:
applying resin to a plurality of spots on an application target surface of one of the EL substrate and the second substrate, the application target surface being a surface to which the resin is applied for forming the resin layer; and
stacking the EL substrate and the second substrate after the applying of the resin, wherein
in the applying of the resin, an amount of the resin in a spot near an edge of the application target surface is less than an amount of the resin in a spot further inward on the application target surface than the spot near the edge,
the applying of the resin includes:
applying the resin of a first amount to each of a plurality of spots in an edge region of the application target surface, the edge region including the spot near the edge; and
applying the resin of a second amount greater than the first amount to each of one or more spots in an inner region of the application target surface, the inner region being further inward on the application target surface than the edge region, the inner region including the spot further inward,
an edge region spot count, which indicates a number of spots per unit area the resin of the first amount is applied to in the edge region, is greater than an inner region spot count, which indicates a number of spots per the unit area the resin of the second amount is applied to in the inner region, and the first amount and the second amount are controlled such that a product of the resin of the first amount and the edge region spot count is equal to a product of the resin of the second amount and the inner region spot count.

2. The method according to claim 1, wherein
the applying of the resin further includes:
applying the resin of a third amount greater than the second amount to each of one or more spots in a second inner region of the application target surface, the second inner region being further inward on the application target surface than the inner region, and
the inner region spot count is greater than a second inner region spot count, which indicates a number of spots per the unit area the resin of the third amount is in the second inner region.

3. The method according to claim 1, wherein
an amount of the resin applied to each of the plurality of spots on the application target surface decreases in accordance with a decrease in a distance from the edge of the application target surface, and
a number of spots per the unit area to which the resin is applied increases in accordance with the decrease in the distance from the edge of the application target surface.

4. The method according to claim 1, wherein
in applying the resin to the plurality of spots on the application target surface, a plunger applies pressure to the resin which is contained in a syringe to discharge the resin dropwise.

5. The method according to claim 2, wherein the third amount is controlled such that a product of the resin of the third amount and the second inner region spot count is equal to the product of the resin of the second amount and the inner region spot count.

6. The method according to claim 1, wherein the edge region of the application target surface includes a rectangular area which surrounds the inner region of the application target surface.

7. The method according to claim 1, further comprising:
forming a dam along edges of the one of the EL substrate and the second substrate, the application target surface being surrounded by the dam.

8. The method according to claim 7, wherein
an amount of the resin applied to each of the plurality of spots on the application target surface decreases in accordance with a decrease in a distance from the dam, and
a number of spots per the unit area to which the resin is applied increases in accordance with the decrease in the distance from the edge of the dam.

9. The method according to claim 8, wherein
in the applying of the resin, the resin is applied to each of the plurality of spots in the edge region with accuracy being prioritized and applied to each of the one or more spots in the inner region with efficiency being prioritized.

* * * * *